US010798325B2

United States Patent
Murata et al.

(10) Patent No.: US 10,798,325 B2
(45) Date of Patent: Oct. 6, 2020

(54) ELECTRONIC DEVICE WITH IMAGE SENSOR THAT INCLUDES PHOTOELECTRIC CONVERTING SECTIONS THAT START TO STORE ELETRICAL CHARGE AT DIFFERENT TIMINGS

(71) Applicant: NIKON CORPORATION, Tokyo (JP)

(72) Inventors: Hironobu Murata, Yokohama (JP); Shiro Tsunai, Kawasaki (JP); Takashi Kuriyama, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/185,638

(22) Filed: Nov. 9, 2018

(65) Prior Publication Data

US 2019/0104266 A1    Apr. 4, 2019

Related U.S. Application Data

(63) Continuation of application No. 15/261,049, filed on Sep. 9, 2016, now Pat. No. 10,205,901, which is a
(Continued)

(30) Foreign Application Priority Data

Dec. 6, 2013 (JP) ................................. 2013-252940

(51) Int. Cl.
*H04N 5/369* (2011.01)
*H01L 27/146* (2006.01)
(Continued)

(52) U.S. Cl.
CPC ....... *H04N 5/3696* (2013.01); *H01L 27/1464* (2013.01); *H01L 27/14621* (2013.01);
(Continued)

(58) Field of Classification Search
CPC ............... H04N 5/3696; H04N 5/3745; H04N 5/35563; H04N 5/3765; H04N 5/378;
(Continued)

(56) References Cited

U.S. PATENT DOCUMENTS 7,382,407 B2 *  6/2008  Cho ........................ H04N 3/155
                                                        257/291
7,755,689 B2 *  7/2010  Stevens .................. H04N 5/378
                                                        250/208.1
(Continued)

FOREIGN PATENT DOCUMENTS

JP     2005-328135 A    11/2005
JP     2006-303752 A    11/2006
(Continued)

OTHER PUBLICATIONS

Oct. 8, 2018 Office Action issued in Chinese Application No. 201480073715.8.
(Continued)

*Primary Examiner* — Ngoc Yen T Vu
(74) *Attorney, Agent, or Firm* — Oliff PLC

(57) ABSTRACT

An image sensor is provided, the image sensor including: an imaging unit that has a first imaging region and a second imaging region, and outputs: a first pixel signal generated according to light incident on the first imaging region; and a second pixel signal generated according to light incident on the second imaging region; a first ramp generating unit that generates a first ramp signal; a second ramp generating unit that generates a second ramp signal; a first signal converting unit that converts the first pixel signal into a first digital image signal based on a result of comparison between the first pixel signal and the first ramp signal; and a second signal converting unit that converts the second pixel signal into a second digital image signal based on a result of
(Continued)

comparison between the second pixel signal and the second ramp signal.

25 Claims, 16 Drawing Sheets

Related U.S. Application Data continuation of application No. 15/102,238, filed as application No. PCT/JP2014/081791 on Dec. 1, 2014, now abandoned.

(51) Int. Cl.
| | | |
|---|---|---|
| *H04N 5/378* | (2011.01) | |
| *H04N 5/355* | (2011.01) | |
| *H04N 5/3745* | (2011.01) | |
| *H04N 5/376* | (2011.01) | |

(52) U.S. Cl.
CPC .. *H01L 27/14627* (2013.01); *H01L 27/14634* (2013.01); *H01L 27/14636* (2013.01); *H04N 5/35563* (2013.01); *H04N 5/378* (2013.01); *H04N 5/3745* (2013.01); *H04N 5/3765* (2013.01)

(58) Field of Classification Search
CPC ......... H01L 27/14621; H01L 27/14627; H01L 27/14636; H01L 27/14634
See application file for complete search history.

(56) References Cited

U.S. PATENT DOCUMENTS

| | | | |
|---|---|---|---|
| 8,488,034 B2 | 7/2013 | Nishihara | |
| 8,606,051 B2 | 12/2013 | Wang et al. | |
| 9,088,741 B2* | 7/2015 | Sumi | H04N 5/243 |
| 9,225,923 B2* | 12/2015 | Hashimoto | H04N 5/3696 |
| 9,899,447 B2* | 2/2018 | Mabuchi | H01L 27/14654 |
| 9,909,856 B2 | 3/2018 | Bridges | |
| 2005/0253942 A1 | 11/2005 | Muramatsu et al. | |
| 2012/0039548 A1 | 2/2012 | Wang et al. | |
| 2012/0081589 A1 | 4/2012 | Nishihara | |
| 2013/0057744 A1 | 3/2013 | Minagawa et al. | |
| 2013/0229543 A1 | 9/2013 | Hashimoto et al. | |
| 2014/0313385 A1 | 10/2014 | Sato et al. | |
| 2014/0326856 A1* | 11/2014 | Massetti | H01L 27/14636 250/208.1 |
| 2015/0195470 A1 | 7/2015 | Millet et al. | |

FOREIGN PATENT DOCUMENTS

| | | |
|---|---|---|
| JP | 2011097581 A | 5/2011 |
| JP | 2013211832 A | 10/2013 |
| JP | 2015-035637 A | 2/2015 |
| WO | 2013/080412 A1 | 6/2013 |
| WO | 2013084809 A1 | 6/2013 |
| WO | 2013150120 A1 | 10/2013 |

OTHER PUBLICATIONS

Feb. 3, 2015 Search Report issued in International Patent Application No. PCt/JP2014/081791.
Jul. 17, 2017 Extended European Search Report issued in European Patent Application No. 14868028.3.
Snoeij et al., "Multiple-Ramp Column-Parallel ADC Architectures for CMOS Image Sensors," IEEE Journal of Solid-State Circuits vol. 42, No. 12, pp. 2968-2977, Dec. 2007.
Nov. 30, 2017 Office Action issued in U.S. Appl. No. 15/261,049.
Jan. 30, 2018 Office Action issued in Japanese Application No. 2013-252940.
Aug. 26, 2019 Office Action issued in Indian Patent Application No. 201617023151.
Nov. 26, 2019 Office Action issued in Japanese Patent Application No. 2018-189526.

* cited by examiner

ELECTRONIC DEVICE WITH IMAGE SENSOR THAT INCLUDES PHOTOELECTRIC CONVERTING SECTIONS THAT START TO STORE ELETRICAL CHARGE AT DIFFERENT TIMINGS

This is a Continuation of application Ser. No. 15/261,049, filed Sep. 9, 2016 which is a Continuation of application Ser. No. 15/102,238 filed Sep. 9, 2016, which in turn is a National Stage Application of PCT/JP2014/081791 filed Dec. 1, 2014, which claims the benefit of Japanese Patent Application No. 2013-252940, filed Dec. 6, 2013. The entire disclosures of the prior applications are hereby incorporated by reference herein in their entirety.

BACKGROUND

1. Technical Field

The present invention relates to an image sensor and an imaging apparatus.

2. Related Art

Conventionally, an imaging apparatus comprising, as AD converters that convert signals from a CMOS image sensor or the like into digital signals, a plurality of AD converters that use ramp waveforms (see for example, Patent document 1).

Patent document 1: Japanese Patent Application Publication No. 2006-303752

Because common ramp waveforms are input to the plurality of AD converters, it has been difficult to independently adjust characteristics such as gains for the respective AD converters.

SUMMARY

Therefore, it is an object of an aspect of the innovations herein to provide an image sensor and an imaging apparatus, which are capable of overcoming the above drawbacks accompanying the related art. The above and other objects can be achieved by combinations described in the claims. That is, a first aspect of the present invention provides an image sensor comprising: a plurality of signal lines that read out respective signals light-received by a plurality of light-receiving units that are among a plurality of light-receiving units and are arranged in a first direction; and a control unit that reads out the signals with a difference being generated in timing at which a signal is read out through one signal line among the plurality of signal lines and timing at which a signal is read out through another signal line.

A second aspect of the present invention provides an image sensor comprising: an imaging unit that has a first imaging region and a second imaging region, and outputs: a first pixel signal generated according to light incident on the first imaging region; and a second pixel signal generated according to light incident on the second imaging region; a first ramp generating unit that generates a first ramp signal; a second ramp generating unit that generates a second ramp signal; a first signal converting unit that converts the first pixel signal into a first digital image signal based on a result of comparison between the first pixel signal and the first ramp signal; and a second signal converting unit that converts the second pixel signal into a second digital image signal based on a result of comparison between the second pixel signal and the second ramp signal.

A third aspect of the present invention provides an imaging apparatus comprising the image sensor according to the first or second aspect.

The summary clause does not necessarily describe all necessary features of the embodiments of the present invention. The present invention may also be a sub-combination of the features described above.

DESCRIPTION OF EXEMPLARY EMBODIMENTS

The embodiments do not limit the invention according to the claims, and all the combinations of the features described in the embodiments are not necessarily essential to means provided by aspects of the invention.

Figure 1:
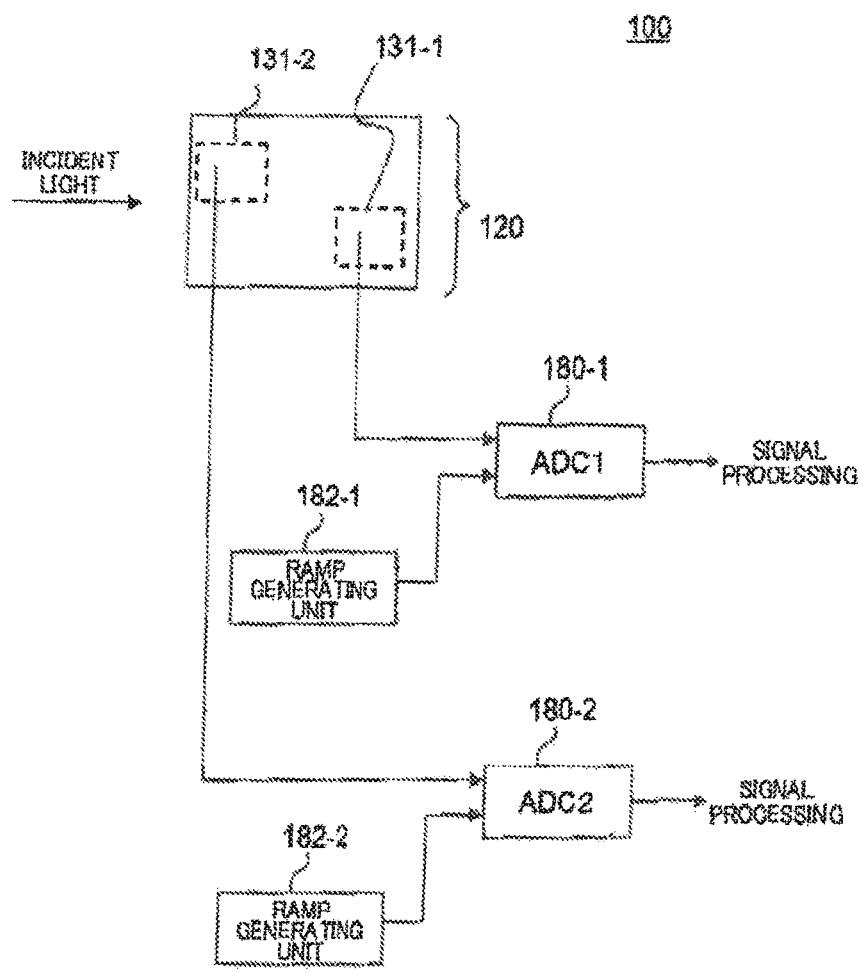
FIG. 1 is a figure showing one example of the configuration of an image sensor 100 according to an embodiment of the present invention.

FIG. 1 is a figure showing one example of the configuration of an image sensor 100 according to an embodiment of the present invention. The image sensor 100 is, for example, a camera that captures a still image or moving image. The image sensor 100 according to the present example comprises an imaging unit 120, a plurality of AD converting units 180 and a plurality of ramp generating units 182.

The imaging unit 120 has a plurality of imaging regions 131. The respective imaging regions 131 store electrical charges according to incident light. The respective imaging regions 131 have one or more photoelectric converting units that convert incident light into electrical charges and store the electrical charges. The photoelectric converting units are one example of light-receiving units. The image sensor 100 generates pixel signals according to incident light by reading out the amounts of electrical charges stored by the respective imaging regions 131. In FIG. 1, a first imaging region 131-1 that generates a first pixel signal and a second imaging region 131-2 that generates a second pixel signal are shown.

The first imaging region 131-1 has one or more first photoelectric converting units, and the second imaging region 131-2 has one or more second photoelectric converting units. For example, the imaging unit 120 has a plurality of photoelectric converting units arranged in a matrix form, and the respective imaging regions 131 may include one column of photoelectric converting units. Also, an imaging region 131 may include discretely arranged photoelectric converting units. Also, an imaging region 131 may be a block having predetermined lengths (the numbers of photoelectric converting units) in the row direction and the column direction. Also, among a plurality of photoelectric converting units arranged in a first direction (for example, a plurality of photoelectric converting unit included in a predetermined row or column), some photoelectric converting units may be included in the first imaging region 131-1, and some other photoelectric converting units may be included in the second imaging region 131-2. Signal lines that read out signals according to received light are connected to respective photoelectric converting units.

The AD converting units 180 are provided corresponding to the respective imaging regions 131. In FIG. 1, a first AD converting unit 180-1 and a second AD converting unit 180-2 corresponding to the first imaging region 131-1 and the second imaging region 131-2 are shown. The respective AD converting units 180 are one example of signal converting units that convert, into digital image signals, analog pixel signals according to the amounts of electrical charges stored in the respectively corresponding imaging regions 131. The first AD converting unit 180-1 converts a first pixel signal into a first digital image signal, and the second AD converting unit 180-2 converts a second pixel signal into a second digital image signal. Also, if a plurality of photoelectric converting units is included in an imaging region 131, and AD converting unit 180 may sequentially read out analog signals generated by the plurality of photoelectric converting units according to the amounts of electrical charges, and convert the analog signals into digital image signals. The AD converting units 180 function as signal converting units that convert, into digital signals, signals read out from photoelectric converting units for each of a plurality of signal lines connected to a plurality of photoelectric converting units.

At least two ramp generating units 182 are provided. In FIG. 1, a first ramp generating unit 182-1 and a second ramp generating unit 182-2 provided corresponding to the first AD converting unit 180-1 and the second AD converting unit 180-2 are shown. The respective ramp generating units 182 generate ramp signals. The characteristics of the ramp signals, such as inclinations, that are generated by the respective ramp generating units 182 are independently controllable for each of the ramp generating units 182. The ramp generating units 182 may be provided in a one-to-one correspondence with the plurality of AD converting units 180, and at least some of the ramp generating units 182 may be shared by two or more AD converting units 180.

A ramp generating unit 182 functions as a control unit that controls timing at which a signal is read out through a signal line connected to a photoelectric converting unit. The ramp generating units 182 according to the present example control timing of signal conversion at the respectively corresponding AD converting units 180. The control unit can generate a difference in timing at which a signal is read out through one signal line among a plurality of signal lines and timing at which a signal is read out through another signal line. In one example, the control unit can generate a difference in timing at which a signal is read out through each of a plurality of signal lines. In this case, a ramp generating unit 182 may be provided to each of the plurality of signal lines.

The respective AD converting units 180 convert pixel signals into digital signals based on a result of comparison between ramp signals generated by corresponding ramp generating units 182 and corresponding pixel signals. For example, an AD converting unit 180 converts the level of a pixel signal into a digital value by outputting the digital value according to a length of time from timing at which a ramp signal is received to timing at which the level of the ramp signal crosses the level of the pixel signal.

Because the image sensor 100 according to the present example comprises the plurality of ramp generating units 182, ramp signals with different characteristics can be used for each of the imaging regions 131. For example, by using ramp signals with inclinations that are different for the first imaging region 131-1 and the second imaging region 131-2, the gains of the digital values of digital image signals relative to the analog levels of pixel signals output by the imaging regions 131 can be made different. Also, by using ramp signals generated at different timing for the first imaging region 131-1 and the second imaging region 131-2, timing at which pixel signals output by the imaging regions 131 are read out can be made different from each other. That is, pixel signals can be read out with a difference being generated in timing at which a pixel signal is read out through one signal line among a plurality of signal lines and timing at which a pixel signal is read out through another signal line. By causing the pixel signals to be read out with a difference being generated between signal lines in timing at which pixel signals are read out through the signal lines, the control unit including the ramp generating units 182 may read out, while a first photoelectric converting unit among a plurality of photoelectric converting units is receiving light, a pixel signal received by a second photoelectric converting unit among the plurality of photoelectric converting units.

Figure 2:
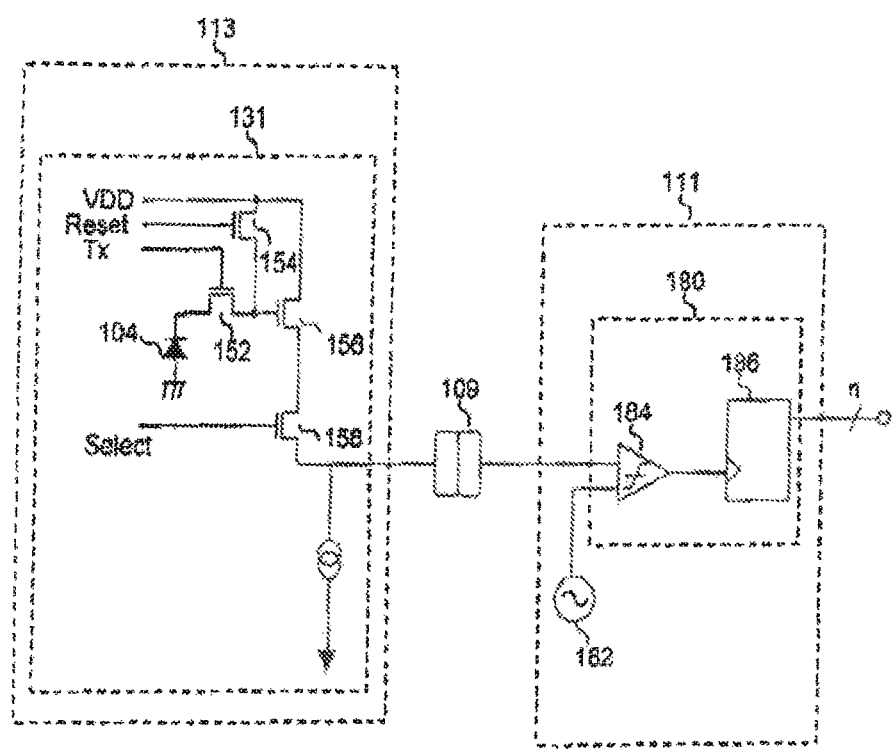
FIG. 2 is a figure showing a configuration example of an imaging region 131 and an AD converting unit 180.

FIG. 2 is a figure showing a configuration example of an imaging region 131 and an AD converting unit 180. In the present example, an imaging unit 120 including a plurality of imaging regions 131 is provided in an imaging chip 113. Also, a plurality of AD converting units 180 and a plurality of ramp generating units 182 are provided in a signal processing chip 111. In FIG. 2, a set of an imaging region 131, an AD converting unit 180 and a plurality of ramp generating units 182 is shown.

The imaging chip 113 and the signal processing chip 111 are semiconductor chips, for example. The signal processing chip 111 is stacked on the imaging chip 113. For example, the signal processing chip 111 is arranged to overlap the imaging chip 113, and is electrically connected with the imaging chip 113 via a bump 109 or the like. In this manner, the imaging unit 120, and the AD converting unit 180 and the ramp generating unit 182 are provided on separate chips so that the plurality of AD converting units 180 and the plurality of ramp generating units 182 can be provided easily while suppressing increase in the area of the imaging unit 120. Also, wire lengths between the respective photoelectric converting units 104 and AD converting units 180 can be made short, and pixel signals can be read out precisely.

The imaging region 131 has a single photoelectric converting unit 104, a transfer transistor 152, a reset transistor 154, an amplification transistor 156 and a selection transistor 158. The source and drain of the transfer transistor 152 are connected to the output terminal of the photoelectric converting unit 104 and the gate of the amplification transistor 156, respectively. The parasitic capacitance of a wire between the output terminal of the photoelectric converting unit 104 and the source of the transfer transistor 152 functions as an electrical charge storing unit that stores electrical charges generated by the photoelectric converting unit 104. The electrical charge storing unit in the present example is part of the photoelectric converting unit 104. The gate of the transfer transistor 152 receives a transfer signal Tx for controlling whether or not to transfer the amount of electrical charges stored by the electrical charge storing unit.

The drain of the reset transistor 154 receives a reference voltage VDD, and its source is connected to the gate of the amplification transistor 156. The gate of the reset transistor 154 receives a reset signal Reset for controlling whether or not to reset the amount of electrical charges stored by the electrical charge storing unit.

The drain of the amplification transistor 156 receives the reference voltage VDD, and its source is connected to the drain of the selection transistor 158. The amplification transistor 156 outputs an analog pixel signal according to the amount of electrical charges transferred from the transfer transistor 152. The gate of the selection transistor 158 receives a selection signal Select, and its source is connected to the AD converting unit 180. The selection transistor 158 inputs a pixel signal from the transfer transistor 152 to the AD converting unit 180 according to the selection signal Select.

Although in the example of FIG. 2, the imaging region 131 having the single photoelectric converting unit 104 is shown, a plurality of photoelectric converting units 104 may be provided in the imaging region 131. If a plurality of photoelectric converting units 104 is provided in the imaging region 131, the corresponding AD converting unit 180 sequentially reads out analog signals according to electrical charges stored in the respective photoelectric converting units 104.

The AD converting unit 180 has a level comparator 184 and a period measuring unit 186. The level comparator 184 compares the level of a ramp signal input from the corresponding ramp generating unit 182, and the level of a pixel signal from the corresponding imaging region 131. For example, the level comparator 184 outputs a logical value 0 during a period in which the level of a pixel signal is lower than the level of a ramp signal, and outputs a logical value 1 during a period in which the level of a pixel signal is equal to or higher than the level of a ramp signal.

The period measuring unit 186 measures a period from the timing when the ramp generating unit 182 started inputting a ramp signal to the level comparator 184 until the level comparator 184 outputs a logical value 1. The period measuring unit 186 may be a counter that receives a clock signal at a predetermined frequency, and counts the pulse count of the clock signal within the period. The period measuring unit 186 outputs a digital value according to the measured length of the period. As one example, the period measuring unit 186 outputs, as a digital value, the pulse count of a clock signal counted within the period.

According to the AD converting unit 180 in the present example, the period from the timing when the ramp generating unit 182 started inputting a ramp signal to the level comparator 184 until the level comparator 184 outputs a logical value 1 changes depending on the inclination of the ramp signal. For this reason, the gain in the AD converting unit 180 can be controlled based on the inclination of a ramp signal.

Figure 3:
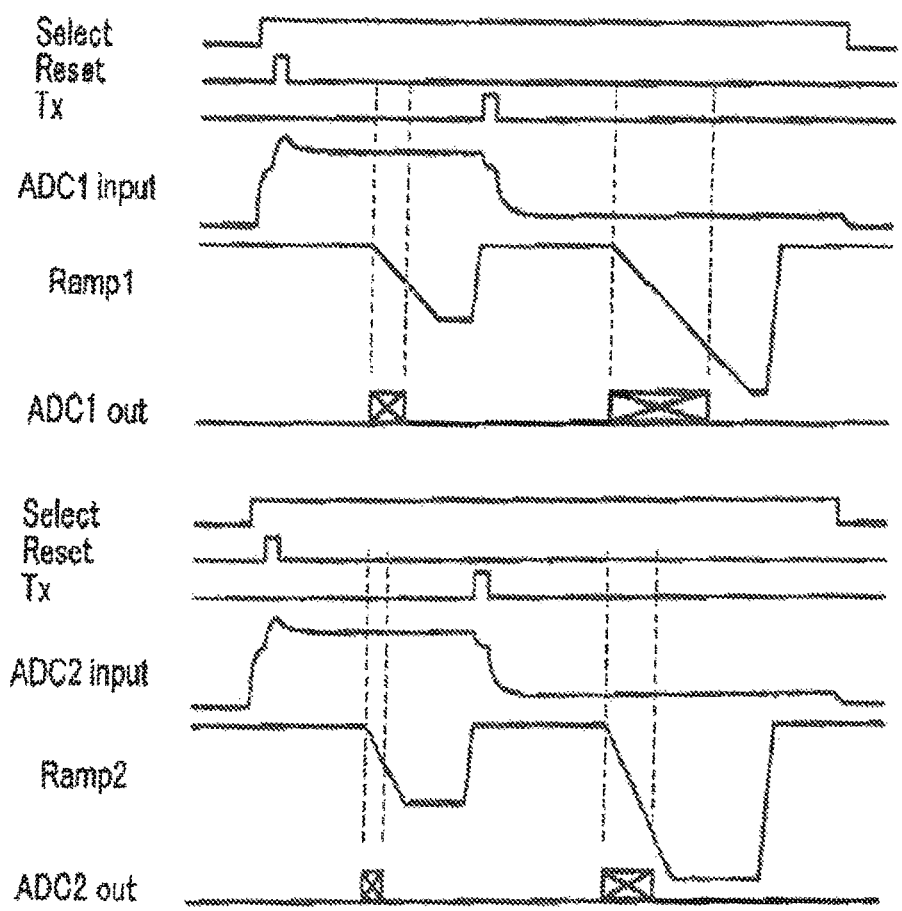
FIG. 3 is a timing diagram showing an operation example of a first imaging region 131-1 and a second imaging region 131-2.

FIG. 3 is a timing diagram showing an operation example of the first imaging region 131-1 and the second imaging region 131-2. In the present example, ramp signals with different inclinations are used for the first imaging region 131-1 and the second imaging region 131-2.

In FIG. 3, ADC1 input indicates the waveform of a first pixel signal input to the first AD converting unit 180-1, Ramp1 indicates the waveform of a first ramp signal generated by the first ramp generating unit 182-1, and ADC1 out indicates, with the length along the time axis, the magnitude of a digital value output by the first AD converting unit 180-1. Similarly, ADC2 input indicates the waveform of a second pixel signal input to the second AD converting unit 180-2, Ramp2 indicates the waveform of a second ramp signal generated by the second ramp generating unit 182-2, and ADC2 out indicates, with the length along the time axis, the magnitude of a digital value output by the second AD converting unit 180-2.

In the present example, the waveforms of the first pixel signal and the second pixel signal are the same for the sake of comparison. Also, the image sensor 100 according to the present example performs so-called correlated double sampling CDS. Upon reception by the reset transistor 154 of a reset signal at the H level, electrical charges stored by the respective photoelectric converting units 104 are reset, and the levels of pixel signals input to the respective AD converting units 180 become a predetermined reference level.

In a state where the levels of pixel signals are stable, the respective ramp generating units 182 generate ramp signals. The initial level of a ramp signal in the present example is higher than the reference level of a pixel signal, and the level decreases at a certain ratio as time elapses. The AD converting unit 180 measures a period from the timing when the level of a ramp signal starts lowering until the timing when the level of the ramp signal becomes lower than the level of a pixel signal. Thereby, the AD converting unit 180 outputs a digital value indicating the reference level of the pixel signal.

Next, upon reception by the transfer transistor 152 of the transfer signal Tx, a pixel signal according to the amount of electrical charges stored by the photoelectric converting unit 104 is input to the AD converting unit 180. In a state where the level of a pixel signal is stable, the ramp generating unit 182 generates a ramp signal. The AD converting unit 180 measures a period from the timing when the level of a ramp signal starts lowering until the timing when the level of the ramp signal becomes lower than the level of a pixel signal. Thereby, the AD converting unit 180 outputs a digital value indicating the level of the pixel signal. Based on the difference between the level and the reference level, the luminance value of a pixel of the photoelectric converting unit 104 is calculated.

As described above, in the present example, ramp signals with different inclinations are used for the first imaging region 131-1 and the second imaging region 131-2. For this reason, as shown in FIG. 3, even if the waveforms of pixel signals are the same, the values of digital image signals output are different. For example, the larger the inclination of the waveform of a ramp signal, the smaller the value of a digital image signal. In this manner, by independently controlling the inclinations of respective ramp signals, the gain between the input and the output in each AD converting unit 180 can be controlled.

The respective ramp generating units 182 may generate ramp signals with different inclinations according to differences in the sensitivity of the corresponding photoelectric converting units 104. Here, sensitivity means the gain in the level of a pixel signal relative to the intensity of incident light. Also, sensitivity may mean the gain in the level of a pixel signal relative to the intensity in a particular wavelength component of incident light.

Figure 4:
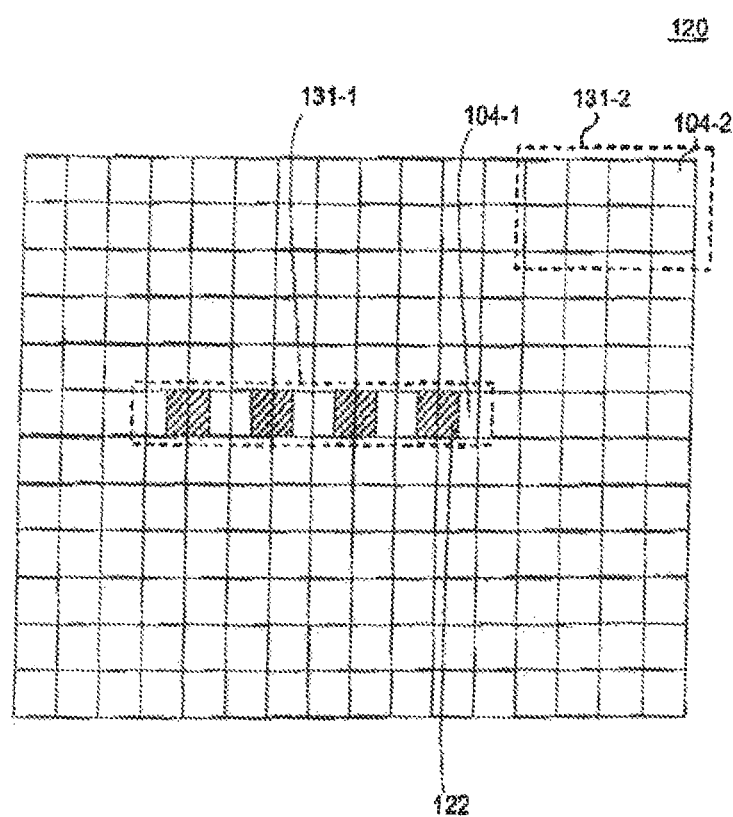
FIG. 4 is a figure showing an example of a plurality of the imaging regions 131.

FIG. 4 is a figure showing an example of the plurality of imaging regions 131. In the present example, the first imaging region 131-1 has a plurality of first photoelectric converting units 104-1, and the second imaging region 131-2 has a plurality of second photoelectric converting units 104-2. It should be noted that although in FIG. 4, only two imaging regions 131 are illustrated, a larger number of imaging regions 131 are included in the imaging unit 120. The respective photoelectric converting units 104 are included in any of the imaging regions 131. It should be noted that the respective transistors shown in FIG. 2 are provided to the respective photoelectric converting units 104.

The first photoelectric converting units 104-1 are photoelectric converting units for focus detection that detect focus positions of an optical system through which incident light has passed. Signals output by the first photoelectric converting units 104-1 are used for other purposes than focus detection, and also as pixel signals to configure an image. The second photoelectric converting units 104-2 are photoelectric converting unit not for focus detection.

In general, the sensitivity of the first photoelectric converting units 104-1 for focus detection is different from the sensitivity of the other second photoelectric converting units 104-2. For example, the first photoelectric converting units 104-1 have light-shielding portions 122 that shield halves of light-receiving surfaces from light. That is, the sensitivity of the first photoelectric converting units 104-1 is in some cases about half of that of the other second photoelectric converting units 104-2. The first ramp generating unit 182-1 generates a ramp signal to compensate for a decrease in the sensitivity. For example, the first ramp generating unit 182-1 generates a ramp signal whose inclination is half of that of the second ramp signal. Thereby, the gain in the first AD converting unit 180-1 is twice the gain in the second AD converting unit 180-2, and the difference in the sensitivity between the first photoelectric converting units 104-1 and the second photoelectric converting units 104-2 can be compensated for.

Figure 5:
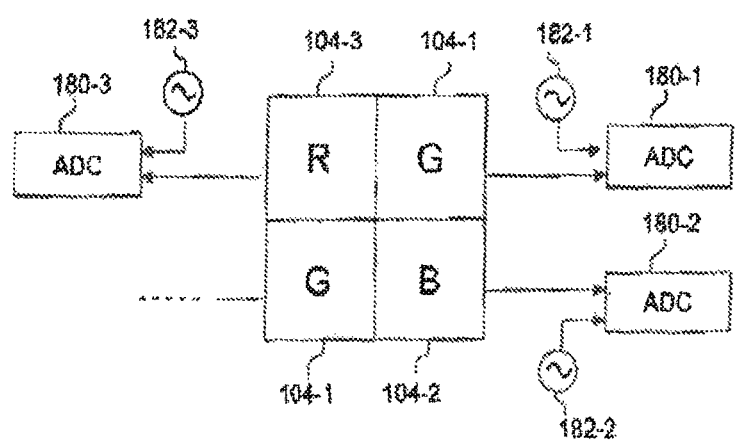
FIG. 5 is a figure showing another example of the plurality of imaging regions 131.

FIG. 5 is a figure showing another example of the plurality of imaging regions 131. The imaging unit 120 according to the present example has three imaging regions 131. In FIG. 5, one or two photoelectric converting units 104 included in the respective imaging regions 131 are shown, and the configuration of the entire imaging regions 131 is omitted. The first photoelectric converting units 104-1 included in first imaging regions 131-1 convert first wavelength components in incident light into first pixel signals. The second photoelectric converting unit 104-2 included in a second imaging region 131-2 converts second wavelength components, which are in incident light and are different from the first wavelength components, into second pixel signals. A third photoelectric converting unit 104-3 included in a third imaging region 131-3 converts third wavelength components, which are in incident light and are different from the first wavelength components and the second wavelength components, into third pixel signals. In the present example, the first wavelength components are components corresponding to green, the second wavelength components are components corresponding to blue, and the third wavelength components are component corresponding to red. The respective photoelectric converting units 104 may have color filters that allow passage of predetermined wavelength components therethrough.

Because the respective photoelectric converting units 104 convert incident light that has passed color filters or the like having different characteristics into pixel signals, the sensitivities of pixel signals for incident light before passage through color filters or the like are not necessarily the same. The respective ramp generating units 182 generate ramp signals having inclinations according to the sensitivities of the corresponding photoelectric converting units 104. Thereby, differences in the sensitivities of the respective photoelectric converting units 104 can be compensated for.

It should be noted that the ramp generating units 182 may be provided to be shared by a plurality of imaging regions 131 having the same sensitivity. For example, the image sensor 100 may comprise three ramp generating units 182 corresponding to respective colors of green, blue and red, and the respective ramp generating units 182 may feed ramp signals to one or more AD converting units 180 corresponding to one or more imaging regions 131 corresponding to the respective colors. Also, the image sensor 100 may further comprise the ramp generating unit 182 corresponding to the imaging region 131 for focus detection shown in FIG. 4.

Figure 6:
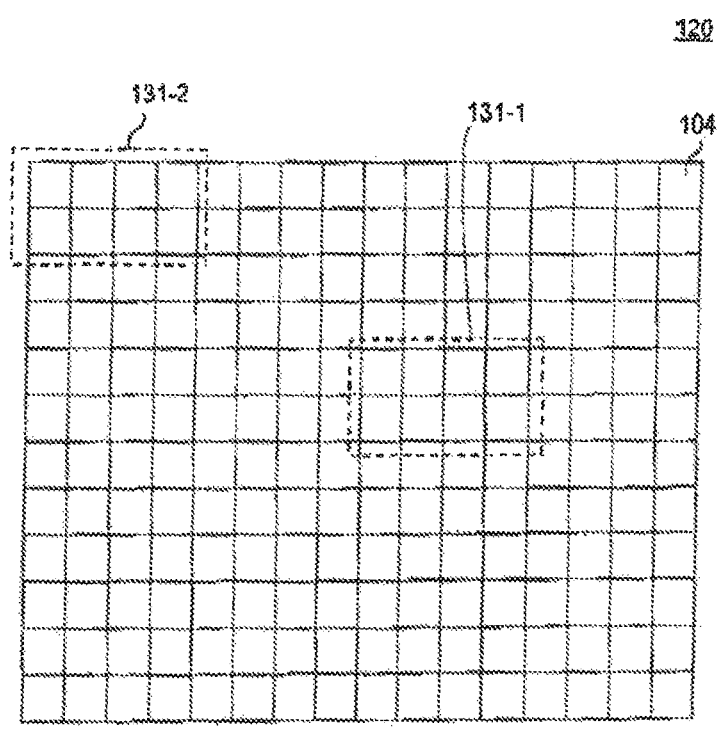
FIG. 6 is a figure showing another example of the plurality of imaging regions 131.

FIG. 6 is a figure showing another example of the plurality of imaging regions 131. The ramp generating unit 182 in the present example controls the inclination of a ramp signal according to the position of a corresponding imaging region 131. For example, the ramp generating unit 182 may control the inclination of a ramp signal according to the distance from the center of the entire imaging region.

By performing control in such a manner, even if variation occurs in the incident light amounts according to the positions of the imaging regions 131 because of characteristics of an optical system, the level differences of pixel signals due to the variation can be compensated for. Inclinations of ramp signals to be adopted for the respective imaging regions 131 may be determined based on the levels of pixel signals output by the respective imaging regions 131 when known reference light is incident thereon.

Figure 7:
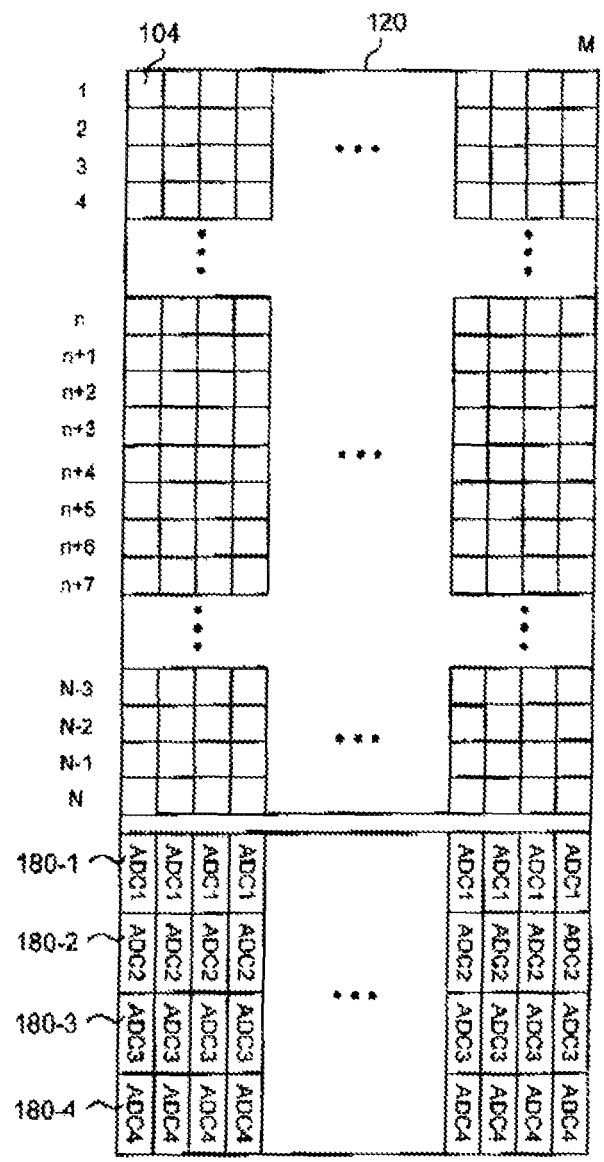
FIG. 7 is a figure showing a configuration example of an imaging unit 120 and a plurality of the AD converting units 180.

FIG. 7 is a figure showing a configuration example of the imaging unit 120 and the plurality of AD converting units 180. It should be noted that although in FIG. 7, ramp generating units 182 are omitted, an AD converting unit 180 and a ramp generating unit 182 are provided in a one-to-one correspondence.

The imaging unit 120 has a plurality of photoelectric converting units 104 arranged in a matrix form. The imaging unit 120 according to the present example has N photoelectric converting units 104 in the column direction and M photoelectric converting units 104 in the row direction. Also, in the present example, the P×M AD converting units 180 are provided. It should be noted that P is a divisor of N, and in the example of FIG. 7, P=4.

In the present example, each of the imaging regions 131 includes N/P photoelectric converting units 104. An AD converting unit 180 and an imaging region 131 correspond to each other in a one-to-one correspondence. That is, each of the AD converting units 180 is provided corresponding to N/P photoelectric converting units 104, and sequentially reads out pixel signals of corresponding photoelectric converting units 104. In the present example, four AD converting units 180 are provided in each column. The respective AD converting units 180 are connected to every three other photoelectric converting units 104 in the corresponding column.

For example, the first AD converting unit 180-1 is connected to the first, fifth, ninth, n-th, (n+4)-th, . . . , (N−3)-th photoelectric converting units 104 in the corresponding column. Similarly, the second AD converting unit 180-2 is connected to the second, sixth, tenth, (n+1)-th, (n+5)-th, . . . , (N−2)-th photoelectric converting units 104 in the corresponding column. The third AD converting unit 180-3 is connected to the third, seventh, eleventh, (n+2)-th, (n+6)-th, . . . , (N−1)-th photoelectric converting units 104 in the corresponding column, and the fourth AD converting unit 180-4 is connected to the fourth, eighth, twelfth, (n+3)-th, (n+7)-th, . . . , N-th photoelectric converting units 104 in the corresponding column.

It should be noted that in the example shown in FIG. 7, the plurality of AD converting units 180 and the plurality of ramp generating units 182 are provided, in the imaging unit 120, on the same plane as the plurality of photoelectric converting units 104. P AD converting units 180 provided in the same column may read out pixel signals at the same timing, or can read out pixel signals at different timing.

Figure 8:
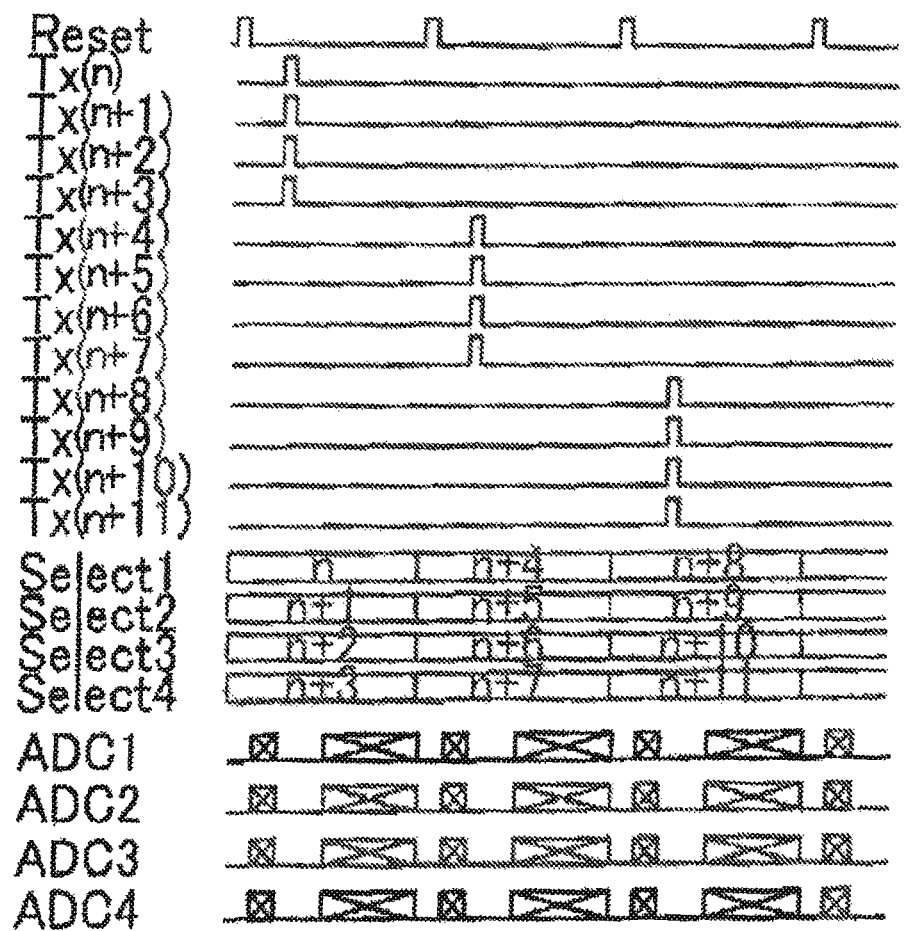
FIG. 8 is a timing diagram showing an operation example of four AD converting units 180 provided in the same column.

FIG. 8 is a timing diagram showing an operation example of four AD converting units 180 provided in the same column. In the present example, four pixel signals of photoelectric converting units 104 in the same column are read out at once simultaneously. In FIG. 8, Selectx indicates the number of a photoelectric converting unit 104 that inputs a pixel signal to the x-th AD converting unit 180.

The respective photoelectric converting units 104 receive the same reset signal Reset. The cycle of the reset signal Reset is, in one example, 2 to 20 μs. Then, the n-th, (n+1)-th, (n+2)-th and (n+3)-th photoelectric converting units 104 receive transfer signals Tx at the same timing. Also, as photoelectric converting units 104 that should read out pixel signals, the n-th, (n+1)-th, (+2)-th and (n+3)-th photoelectric converting units 104 are selected simultaneously by a select signal Select. The respective AD converting units 180 simultaneously read out pixel signals of the selected photoelectric converting units 104.

Then, according to the next reset signal Reset, pixel signals of the (n+4)-th, (+5)-th, (n+6)-th and (n+7)-th photoelectric converting units 104 are read out simultaneously in a similar procedure. With such operation, pixel signals of P (four in the example of FIG. 8) photoelectric converting units 104 are read out simultaneously every predetermined cycle (for example, 2 to 20 μs). For this reason, if pixel signals of photoelectric converting units 104 in each column are read out in a rolling scheme, differences in the timing of readout equal the cycle of the reset signal Reset.

Figure 9:
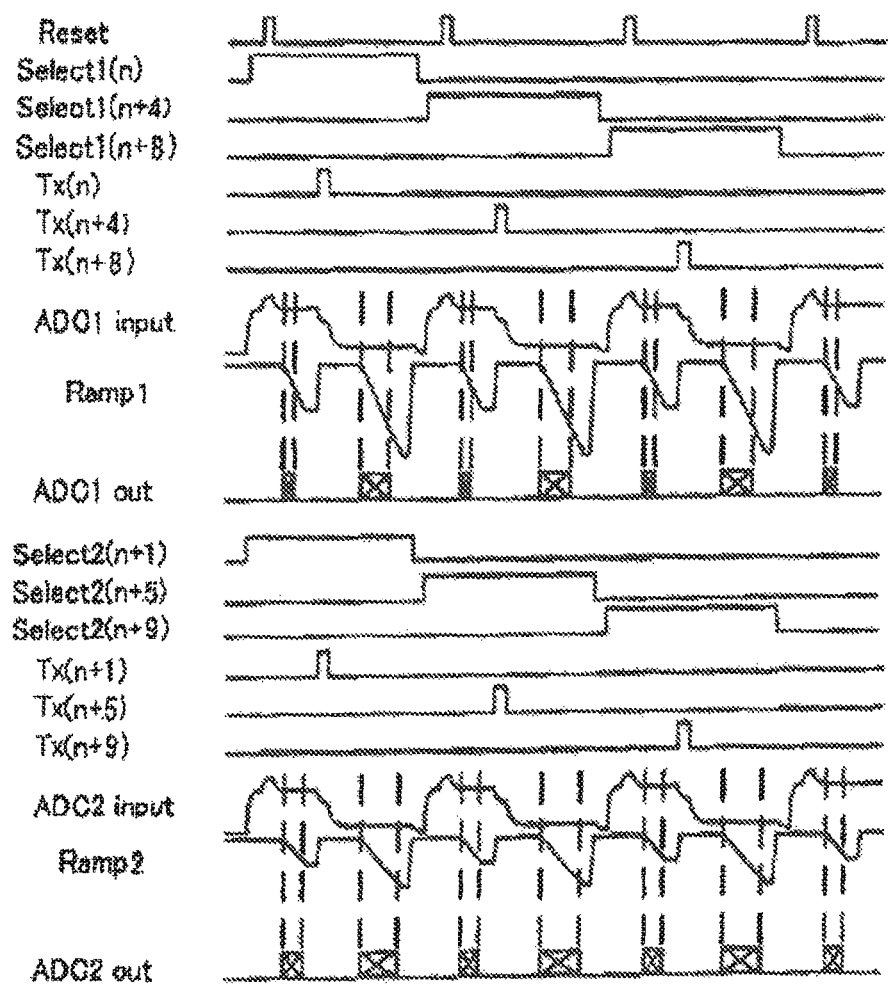
FIG. 9 is a timing diagram showing details of an operation of a first AD converting unit 180-1 and a second AD converting unit 180-2 in the operation example shown in FIG. 8.

FIG. 9 is a timing diagram showing details of an operation of the first AD converting unit 180-1 and the second AD converting unit 180-2 in the operation example shown in FIG. 8. It should be noted that in the present example, similar to the example shown in FIG. 3, the inclinations of the first ramp signal Ramp1 and the second ramp signal Ramp2 are different from each other. As explained with reference to FIG. 3, the gains of the first AD converting unit 180-1 and the second AD converting unit 180-2 are different according to the inclinations of ramp signals. It should be noted that, as explained with reference to FIG. 8, operation timing of the first AD converting unit 180-1 and the second AD converting unit 180-2 are the same.

Figure 10:
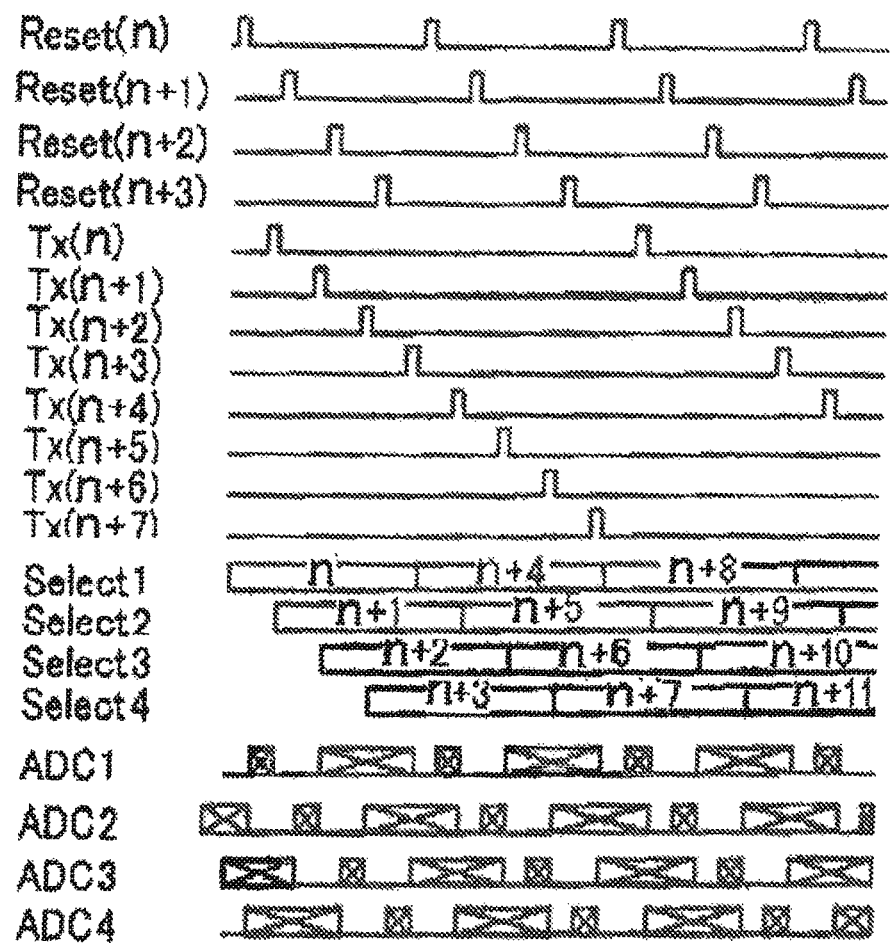
FIG. 10 is a timing diagram showing another operation example of four AD converting units 180 provided in the same column.

FIG. 10 is a timing diagram showing another operation example of four AD converting units 180 provided in the same column. In the present example, the timing of readout of four AD converting units 180 is staggered by ΔT. Specifically, the timing of readout of the respective AD converting units 180 is staggered by the cycle of reset signals (for example, 2 to 20 μs) divided by P. In the present example, the shift ΔT in the timing of readout=2 to 20 μs/4=0.5 to 5 μs.

In the present example, the phases of reset signals input to the respective photoelectric converting units 104 are staggered by ΔT. Also, the phases of transfer signals Tx and selection signals Select input to the respective photoelectric converting units 104 are staggered by ΔT. Also, the timing of readout of AD converting units 180 is staggered by ΔT.

Figure 11:
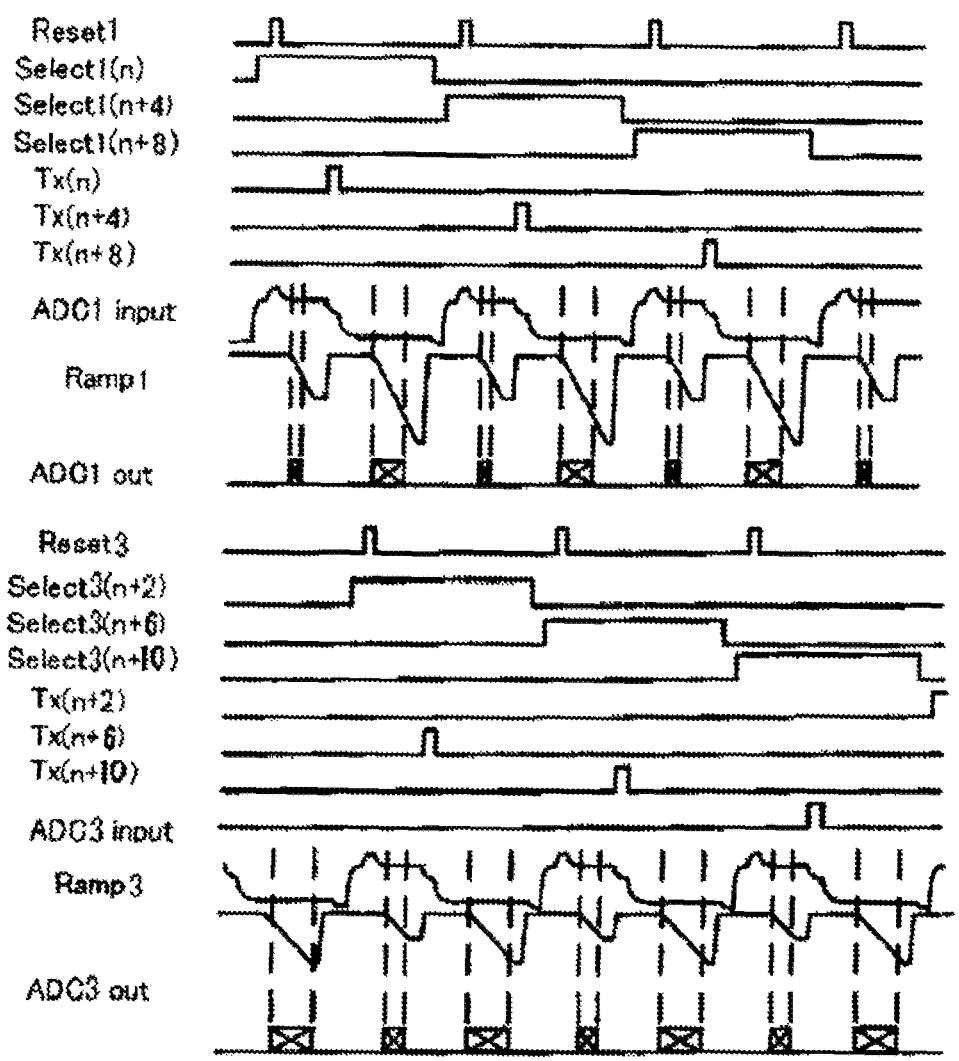
FIG. 11 is a timing diagram showing details of an operation of the first AD converting unit 180-1 and a third AD converting unit 180-3 in the operation example shown in FIG. 10.

FIG. 11 is a timing diagram showing details of an operation of the first AD converting unit 180-1 and the third AD converting unit 180-3 in the operation example shown in FIG. 10. It should be noted that in the present example, similar to the example shown in FIG. 3, the inclinations of the first ramp signal Ramp1 and the third ramp signal Ramp3 are different from each other.

Also, in order for the timing of readout of the AD converting units 180 to be staggered by ΔT, the timing at which the respective ramp generating units 182 generate ramp signals is staggered by ΔT. That is, the timing of a first ramp signal Ramp1 and a third ramp signal Ramp3 is staggered by 2×ΔT. The timing at which the respective ramp generating units 182 generate ramp signals is, for example, timing that is delayed from a corresponding reset signal Reset by a predetermined delay amount.

As shown in FIG. 10 and FIG. 11, by causing the timing of ramp signals to be staggered, differences in the timing of readout at which pixel signals are read out in a rolling scheme can be made 1/P-fold in comparison to that in the example shown in FIG. 8 and FIG. 9. For this reason, an image with less distortion can be obtained.

Figure 12:
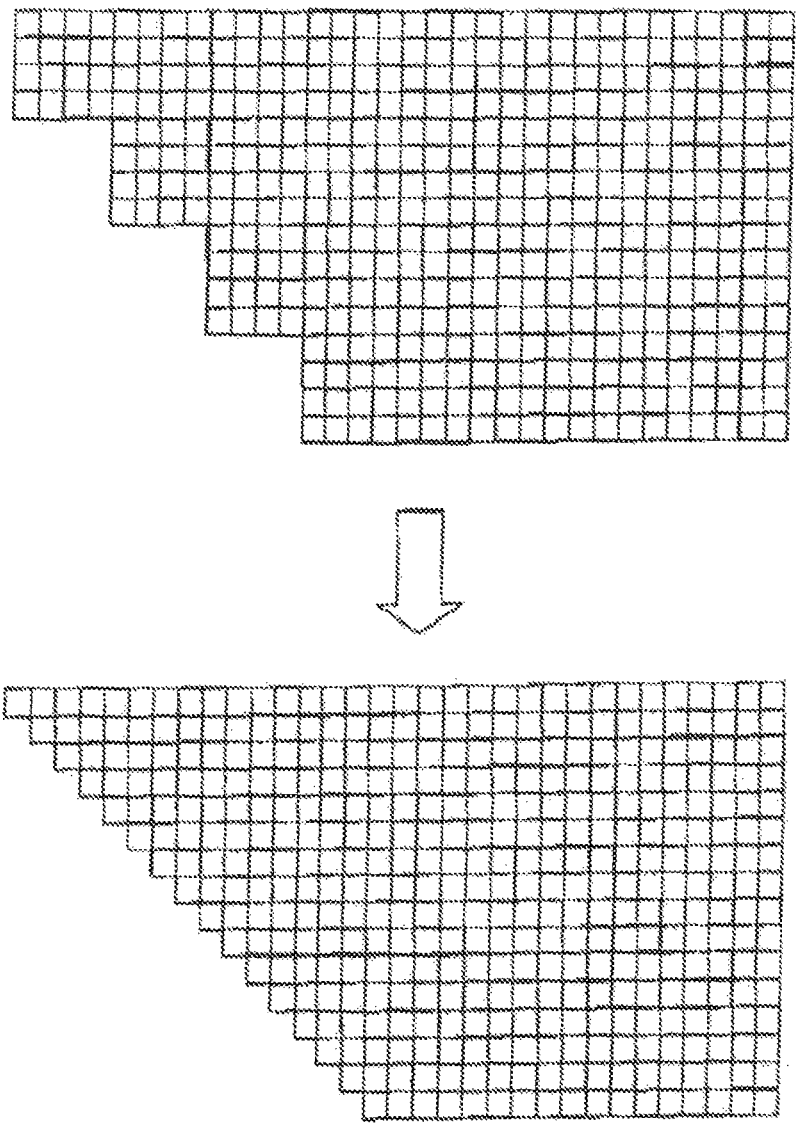
FIG. 12 is a figure showing an image of differences in the timing of readout in rolling readout.

FIG. 12 is a figure showing an image of differences in the timing of readout in rolling readout. The top portion of FIG. 12 shows differences in the timing of readout in the example shown in FIG. 8 and FIG. 9, and the bottom portion shows differences in the timing of readout in the example shown in FIG. 10 and FIG. 11.

In FIG. 12, the left edges in the row direction indicate the timing of readout of photoelectric converting units 104 in respective rows. That is, steps in the row direction indicate timing differences. As described above, by causing the timing of ramp signals in the ramp generating units 182 to be staggered, differences in the timing of readout can be made 1/P-fold.

Figure 13A:
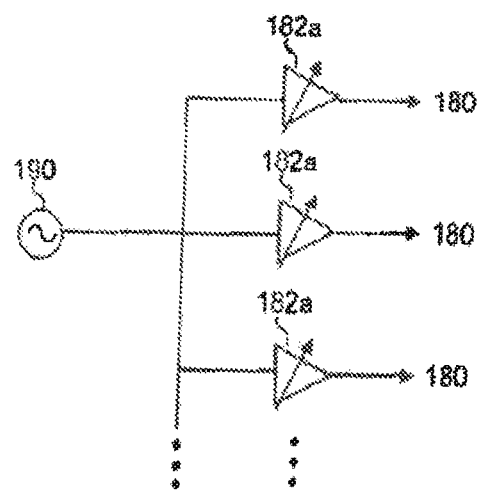
FIG. 13A is a figure showing a configuration example of a plurality of ramp generating units 182.

FIG. 13A is a figure showing a configuration example of a plurality of ramp generating units 182. In the present example, the image sensor 100 has a seed ramp generating unit 190 and a plurality of ramp generating units 182a. The seed ramp generating unit 190 generates seed ramp signals with a predetermined inclination. In the present example, the respective ramp generating units 182a amplifiers that receive seed ramp signals after being branched, and amplify and output the seed ramp signals. Amplification factors in the respective ramp generating units 182a can be controlled independently. Thereby, the respective ramp generating units 182a can generate ramp signals with inclinations according to the amplification factors.

Also, the respective ramp generating units 182a may further have delay variable elements that delay seed ramp signals. Thereby, the respective ramp generating unit 182a can independently control the timing of ramp signals.

Figure 13B:
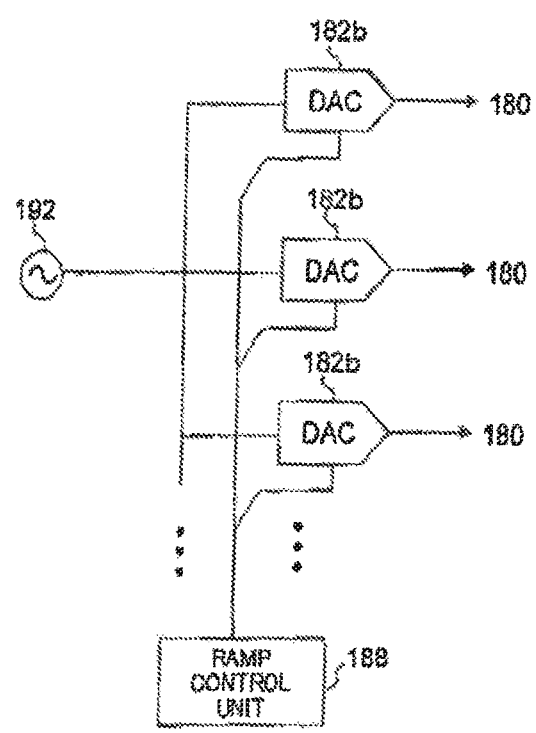
FIG. 13B is a figure showing another configuration example of the plurality of ramp generating units 182.

FIG. 13B is a figure showing another configuration example of the plurality of ramp generating units 182. In the present example, the image sensor 100 has a clock generating unit 192, a plurality of ramp generating units 182b, and a ramp control unit 188. The clock generating unit 192 generates a clock signal at a predetermined frequency. In the present example, the respective ramp generating units 182b have DA converters that output, at the frequency of the clock signal, digital signals given from the ramp control unit 188. The ramp control unit 188 sequentially inputs, to the ramp generating units 182b, digital values whose values change at a predetermined inclination, and causes the ramp generating units 182b to output ramp signals.

The ramp control unit 188 can cause ramp signals with different inclinations to be output by independently controlling the inclinations of digital values for each ramp generating unit 182b. Also, the ramp control unit 188 can cause ramp signals of different start timing to be output by independently controlling the timing to input digital values for each ramp generating unit 182b.

Figure 14:
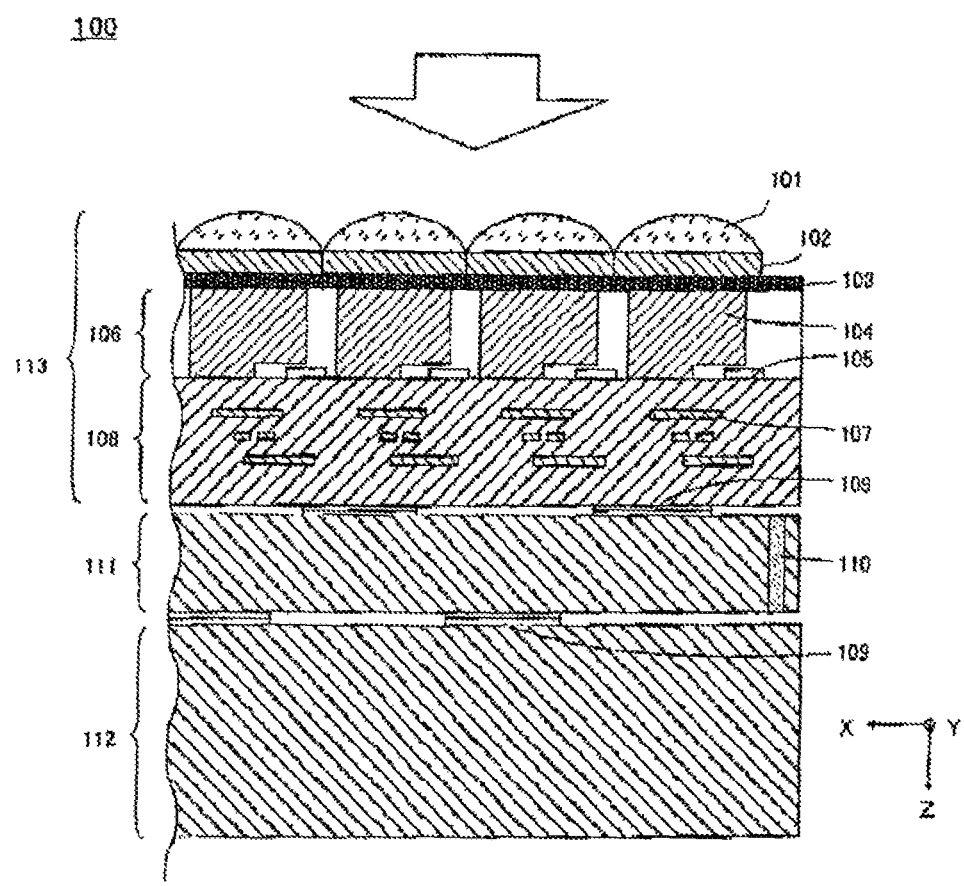
FIG. 14 is a cross-sectional view of the image sensor 100 according to the present embodiment.

FIG. 14 is a cross-sectional view of the image sensor 100 according to the present embodiment. Although in the present example, a so-called backside irradiation-type image sensor 100 is shown, but the image sensor 100 is not limited to the backside irradiation-type, but may be a front side irradiation-type. The image sensor 100 only has to have a structure comprising a laminate chip stacked on the imaging chip 113.

The image sensor 100 according to the present example comprises the imaging chip 113 that outputs a pixel signal corresponding to incident light, the signal processing chip 111 that processes the pixel signal, and a memory chip 112 that stores a digital image signal. These imaging chip 113, signal processing chip 111 and memory chip 112 are stacked on each other, and are electrically connected with each other by a plurality of electrically conductive bumps 109 such as Cu. In the present example, the signal processing chip 111 and the memory chip 112 are equivalent to the above-mentioned laminate chip.

It should be noted that as illustrated, incident light is incident mainly in the positive Z-axis direction indicated by an outline arrow. In the present embodiment, the surface of the imaging chip 113 on which the incident light is incident is called a backside. Also, as shown in the coordinate axes, the rightward direction on the sheet that is orthogonal to the Z-axis is defined as the positive X-axis direction, and the direction toward readers on the sheet that is orthogonal to the Z-axis and the X-axis is defined as the positive Y-axis direction.

One example of the imaging chip 113 is a backside irradiation-type MOS image sensor. The imaging chip 113 corresponds to the imaging unit 120 shown in FIG. 1 to FIG. 13B. A PD layer 106 is disposed on the rear surface side of a wiring layer 108. The PD layer 106 has a plurality of the photoelectric converting units 104 that generate electrical charges according to light. The imaging chip 113 outputs pixel signals according to the electrical charges. The PD layer 106 according to the present example has the plurality of photoelectric converting units 104 disposed two-dimensionally, and transistors 105 that are provided corresponding to the photoelectric converting units 104. The transistors 105 correspond to the respective transistors in FIG. 2 or other figures.

The side of the PD layer 106 on which incident light is incident is provided with color filters 102 with a passivation film 103 interposed therebetween. There are multiple types of the color filters 102 that allow passage of light of mutually different wavelength regions, and the color filters 102 are arrayed in specific manners corresponding to the respective photoelectric converting units 104. A set of a color filter 102, a photoelectric converting unit 104 and a transistor 105 forms one pixel.

The side of the color filter 102 on which incident light is incident is provided with microlenses 101 corresponding to respective pixels. The microlenses 101 concentrate incident light toward corresponding photoelectric converting units 104.

The wiring layer 108 has a wire 107 that transmits pixel signals from the PD layer 106 to the signal processing chip 111. The wire 107 may be multilayered, and may be provided with an active element or a passive element.

A plurality of the bumps 109 are disposed on the front surface of the wiring layer 108. The plurality of bumps 109 are aligned with a plurality of the bumps 109 provided on an opposite surface of the signal processing chip 111, and the imaging chip 113 and the signal processing chip 111 are pressurized for example; thereby, the aligned bumps 109 are joined and electrically connected with each other.

Similarly, a plurality of the bumps 109 are disposed on mutually opposite surfaces of the signal processing chip 111 and the memory chip 112. These bumps 109 are aligned with each other, and the signal processing chip 111 and the memory chip 112 are pressurized for example; thereby, the aligned bumps 109 are joined and electrically connected with each other.

It should be noted that the bumps 109 may be joined with each other not only by Cu bump joining by solid phase diffusion, but also by micro bump coupling by solder melting. Also, one bump 109 or a plurality of bumps 109 may be provided to one output wire described below, for example. Accordingly, the size of the bumps 109 may be larger than the pitch of the photoelectric converting units 104. Also, in a peripheral region other than a pixel region in which pixels are arrayed, bumps larger than the bumps 109 corresponding to the pixel region may be provided as well.

The signal processing chip 111 receives analog pixel signals output by the imaging chip 113. The signal processing chip 111 performs predetermined signal processing on the received pixel signals, and outputs the processed pixel signals to the memory chip 112. The memory chip 112 stores the signals received from the signal processing chip 111.

The signal processing chip 111 according to the present example is provided with the plurality of AD converting units 180 and the plurality of ramp generating units 182. The signal processing chip 111 may perform predetermined operation such as correction on the digital image signals.

At least some of the plurality of AD converting units 180 are arranged in two dimensions on an ADC arrangement plane that is parallel to a plane on which a plurality of pixels are provided. For example, in the imaging chip 113, a plurality of pixels are arranged in two dimensions along the row direction and the column direction, and in the signal processing chip 111, the plurality of AD converting units 180 are arranged in two dimensions along the row direction and the column direction. The plurality of AD converting units 180 are preferably arranged at constant intervals in the signal processing chip 111. Also, the plurality of AD converting units 180 may be non-uniformly arranged on the ADC arrangement plane of the signal processing chip 111. For example, the plurality of AD converting units 180 may be arranged such that the density of them becomes higher at edge portions of the ADC arrangement plane of the signal processing chip 111 than at the center thereof.

Also, the plurality of AD converting units 180 may be arranged, in the signal processing chip 111, on a plurality of ADC arrangement planes whose positions in the Z-axis direction are different. That is, the signal processing chip 111 may be a multilayered chip, and the plurality of AD converting units 180 may be provided in different layers. In this case also, if the positions at which the plurality of AD converting units 180 are arranged are projected onto a single ADC arrangement plane, the respective AD converting units 180 are preferably arranged at constant intervals.

Also, the signal processing chip 111 has a TSV (through-silicon via) 110 connecting, with each other, circuits respectively provided to the front and rear surfaces. The TSV 110 is preferably provided in a peripheral region. Also, the TSV 110 may also be provided to a peripheral region of the imaging chip 113 and the memory chip 112.

Figure 15:
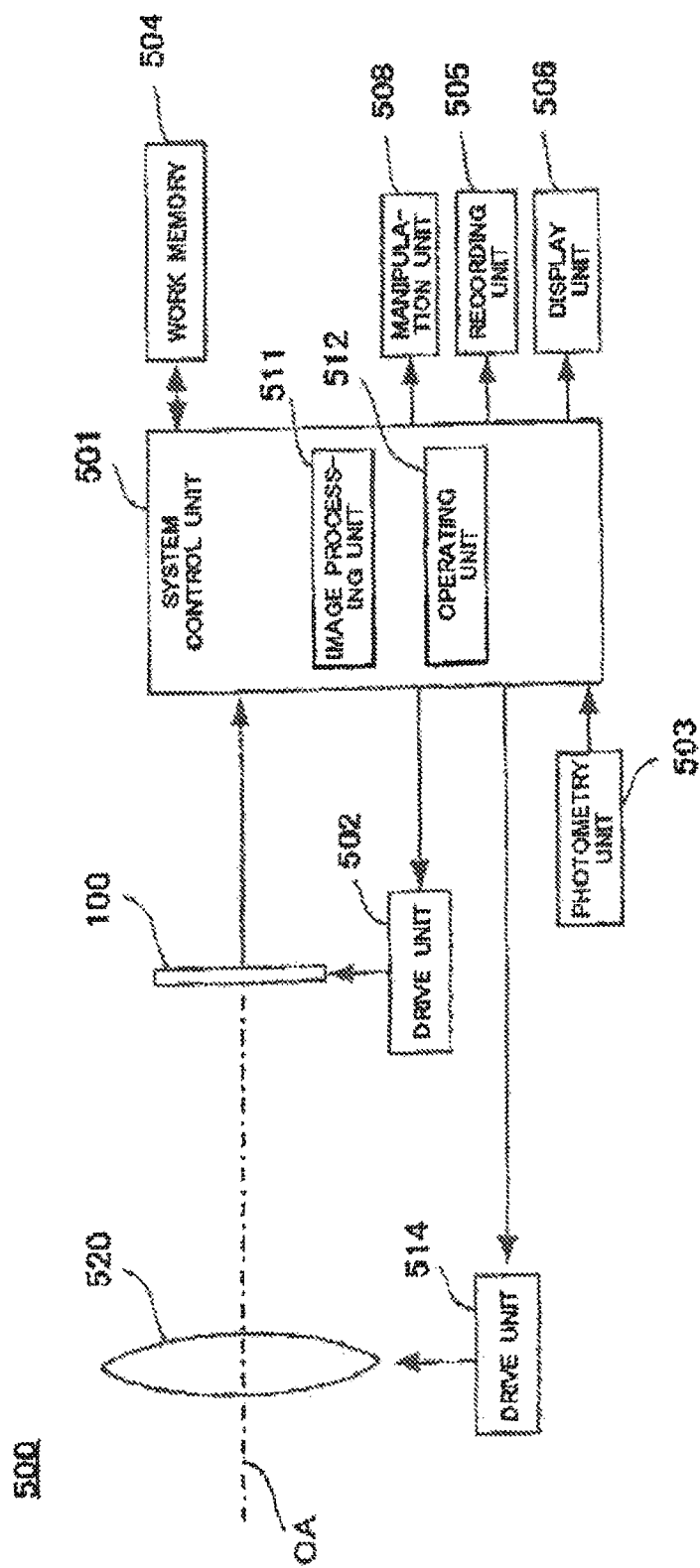
FIG. 15 is a block diagram showing a configuration example of an imaging apparatus 500 according to an implementation example.

FIG. 15 is a block diagram illustrating a configuration example of an imaging apparatus 500 according to an implementation example. The imaging apparatus 500 comprises an imaging lens 520 as an imaging optical system, and the imaging lens 520 guides a subject light flux that is incident along an optical axis OA to the image sensor 100. The imaging lens 520 may be a replaceable lens that can be attached to and detached from the imaging apparatus 500. The imaging apparatus 500 mainly comprises the image sensor 100, a system control unit 501, a drive unit 502, a photometry unit 503, a work memory 504, a recording unit 505 and a display unit 506.

The imaging lens 520 is configured with a plurality of groups of optical lenses, and forms, near its focal plane, an image of a subject light flux from a scene. It should be noted that in FIG. 15, the imaging lens 520 is expressed by a single virtual representative lens arranged near the pupil. The drive unit 502 is a control circuit that performs electrical charge storage control such as timing control, region control or the like of the imaging unit 120 according to an instruction from the system control unit 501. The drive unit 502 and the system control unit 501 in the present example may serve the functions of the AD converting unit 180 explained with reference to FIG. 1 to FIG. 13B. As shown in FIG. 14, part of the control circuit that forms the drive unit 502 and the system control unit 501 may be formed as a chip, and stacked on the imaging chip 113.

The image sensor 100 passes a pixel signal to the image processing unit 511 of the system control unit 501. The image sensor 110 is the same as the image sensor 100 explained with reference to FIG. 1 to FIG. 13B. The image processing unit 511 performs various image processing by using the work memory 504 as a work space, and generates image data. For example, if image data in a JPEG file format is to be generated, the image processing unit 511 performs white balancing, gamma processing, or the like, and then performs a compression process. Generated image data is recorded in the recording unit 505, and is converted into a display signal to be displayed on the display unit 506 for a preset length of time.

The photometry unit 503 detects the luminance distribution of a scene prior to a series of image-capturing sequences to generate image data. The photometry unit 503 includes an AE sensor of about one million pixels, for example. The operating unit 512 of the system control unit 501 receives an output of the photometry unit 503 to calculate the luminance of each region of a scene. The operating unit 512 determines the shutter speed, diaphragm value, ISO speed according to the calculated luminance distribution. It should be noted that pixels used in the above-mentioned AE sensor may be provided within the imaging unit 120, and in this case a photometry unit 503 separate from the imaging unit 120 may not be provided.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An electronic device comprising:
an image sensor that includes
  a first photoelectric converting section that converts light into electrical charge,
  a second photoelectric converting section that converts light into electrical charge,
  a first signal line to which a first signal based on electrical charge of the first photoelectric converting section is output, and
  a second signal line to which a second signal based on electrical charge of the second photoelectric converting section is output; and
a control section that performs control in a manner such that, after starting to store electrical charge converted by the first photoelectric converting section, storing electrical charge in the second photoelectric converting section is started, and that, before terminating output of the first signal to the first signal line, output of the second signal to the second signal line is terminated, wherein:
the image sensor further includes
  a first transfer gate that transfers electrical charge of the first photoelectric converting section,
  a second transfer gate that transfers electrical charge of the second photoelectric converting section,
  a first transfer control line, to which a first transfer control signal for controlling the first transfer gate is output, that is connected to the first transfer gate, and
  a second transfer control line, to which a second transfer control signal for controlling the second transfer gate is output, that is connected to the second transfer gate; and
the control section further performs control in a manner such that, before outputting the first transfer control signal to the first transfer control line, the second transfer control signal is output to the second transfer control line.

2. The electronic device according to claim 1, wherein the image sensor includes a first reset section that resets a potential of a first floating diffusion to which electrical charge from the first photoelectric converting section is transferred by the first transfer gate, a second reset section that resets a potential of a second floating diffusion to which electrical charge from the second photoelectric converting section is transferred by the second transfer gate, a first reset control line, to which a first reset control signal for controlling the first rest section is output, and that is connected to the first reset section, a second reset control line, to which a second reset control signal for controlling the second rest section is output, and that is connected to the second reset section, and the control section further performs control in a manner such that, before outputting the second reset control signal to the second reset control line, the first reset control signal is output to the first reset control line.

3. The electronic device according to claim 2, wherein the image sensor includes a first selection section that outputs the first signal to the first signal line, a second selection section that outputs the second signal to the second signal line, a first selection control line, to which a first selection control signal for controlling the first selection section is output, that is connected to the first selection section, and a second selection control line, to which a second selection control signal for controlling the second selection unit section is output, that is connected to the second selection section, and the control section further performs control in a manner such that, before outputting the first selection control signal to the first selection control line, the second selection control signal is output to the second selection control line.

4. The electronic device according to claim 1, wherein the image sensor includes a first signal processing section that performs a signal processing to the first signal output to the first signal line, and a second signal processing section that performs a signal processing to the second signal output to the second signal line.

5. The electronic device according to claim 4, wherein the first signal processing section includes at least a part of a first amplifier circuit for amplifying the first signal, and the second signal processing section includes at least a part of a second amplifier circuit for amplifying the second signal.

6. The electronic device according to claim 4, wherein the first signal processing section includes a first conversion circuit that is used for converting the first signal into a digital signal, and the second signal processing section includes a second conversion circuit that is used for converting the second signal into a digital signal.

7. The electronic device according to claim 6, wherein the image sensor includes a first supply line, to which a first ramp signal is supplied, that is connected to the first conversion circuit, and a second supply line, to which a second ramp signal is supplied, that is connected to the second conversion circuit, the second ramp signal having an inclination that is different from an inclination of the first ramp signal.

8. The electronic device according to claim 7, wherein the control section performs a control in a manner such that a timing of output of the first ramp signal to the first supply line is different from a timing of output of the second ramp signal to the second supply line.

9. The electronic device according to claim 6, wherein the image sensor includes an image chip that includes the first photoelectric converting section and the second photoelectric converting section, and a signal processing chip that includes at least a part of the first conversion circuit and at least a part of the second conversion circuit.

10. The electronic device according to claim 9, wherein the image chip is stacked on the signal processing chip.

11. The electronic device according to claim 6, wherein the image sensor includes a first storing section that stores the first signal converted into a digital signal using the first conversion circuit, and a second storing section that stores the second signal converted into a digital signal using the second conversion circuit.

12. The electronic device according to claim 11, wherein the image sensor includes an image chip that includes the first photoelectric converting section and the second photoelectric converting section, a signal processing chip that includes at least a part of the first conversion circuit and at least a part of the second conversion circuit, and a memory chip that includes the first storing section and the second storing section.

13. The electronic device according to claim 12, wherein the image chip is stacked on the memory chip.

14. An electronic device comprising:
an image sensor that includes
a first photoelectric converting section that converts light into electrical charge, a second photoelectric converting section that converts light into electrical charge, a first signal line to which a first signal based on electrical charge of the first photoelectric converting section is output, and a second signal line to which a second signal based on electrical charge of the second photoelectric converting section is output; and a control section that performs control in a manner such that, after starting to store electrical charge converted by the first photoelectric converting section, storing electrical charge in the second photoelectric converting section is started, and that, before terminating output of the first signal to the first signal line, output of the second signal to the second signal line is terminated, wherein:

the image sensor further includes a first reset section that resets a potential of a first floating diffusion to which electrical charge from the first photoelectric converting section is transferred, a second reset section that resets a potential of a second floating diffusion to which electrical charge from the second photoelectric converting section is transferred, a first reset control line, to which a first reset control signal for controlling the first rest section is output, and that is connected to the first reset section, a second reset control line, to which a second reset control signal for controlling the second rest section is output, and that is connected to the second reset section; and the control section further performs control in a manner such that, before outputting the second reset control signal to the second reset control line, the first reset control signal is output to the first reset control line.

15. The electronic device according to claim 14, wherein the image sensor includes
a first selection section that outputs the first signal to the first signal line,
a second selection section that outputs the second signal to the second signal line,
a first selection control line, to which a first selection control signal for controlling the first selection section is output, that is connected to the first selection section, and
a second selection control line, to which a second selection control signal for controlling the second selection section is output, that is connected to the second selection section, and the control section further performs control in a manner such that, before outputting the first selection control signal to the first selection control line, the second selection control signal is output to the second selection control line.

16. The electronic device according to claim 14, wherein the image sensor includes
a first signal processing section that performs a signal processing to the first signal output to the first signal line, and
a second signal processing section that performs a signal processing to the second signal output to the second signal line.

17. The electronic device according to claim 16, wherein the first signal processing section includes at least a part of a first amplifier circuit for amplifying the first signal, and
the second signal processing section includes at least a part of a second amplifier circuit for amplifying the second signal.

18. The electronic device according to claim 16, wherein the first signal processing section includes a first conversion circuit that is used for converting the first signal into a digital signal, and the second signal processing section includes a second conversion circuit that is used for converting the second signal into a digital signal.

19. The electronic device according to claim 18, wherein the image sensor includes
a first supply line, to which a first ramp signal is supplied, that is connected to the first conversion circuit, and
a second supply line, to which a second ramp signal is supplied, that is connected to the second conversion circuit, the second ramp signal having an inclination that is different from an inclination of the first ramp signal.

20. The electronic device according to claim 19, wherein the control section performs a control in a manner such that a timing of output of the first ramp signal to the first supply line is different from a timing of output of the second ramp signal to the second supply line.

21. The electronic device according to claim 18, wherein the image sensor includes
an image chip that includes the first photoelectric converting section and the second photoelectric converting section, and
a signal processing chip that includes at least a part of the first conversion circuit and at least a part of the second conversion circuit.

22. The electronic device according to claim 21, wherein the image chip is stacked on the signal processing chip.

23. The electronic device according to claim 18, wherein the image sensor includes
a first storing section that stores the first signal converted into a digital signal using the first conversion circuit, and
a second storing section that stores the second signal converted into a digital signal using the second conversion circuit.

24. The electronic device according to claim 23, wherein the image sensor includes
an image chip that includes the first photoelectric converting section and the second photoelectric converting section,
a signal processing chip that includes at least a part of the first conversion circuit and at least a part of the second conversion circuit, and
a memory chip that includes the first storing section and the second storing section.

25. The electronic device according to claim 24, wherein the image chip is stacked on the memory chip.

* * * * *